United States Patent [19]

Shimizu

[11] Patent Number: 4,586,181
[45] Date of Patent: Apr. 29, 1986

[54] TEST PATTERN GENERATING APPARATUS

[75] Inventor: Masao Shimizu, Gyoda, Japan

[73] Assignee: Takeda Riken Co., Ltd., Tokyo, Japan

[21] Appl. No.: 551,429

[22] Filed: Nov. 14, 1983

[30] Foreign Application Priority Data

Nov. 15, 1982 [JP] Japan .............................. 57-200698

[51] Int. Cl.⁴ .......................................... G01R 31/28
[52] U.S. Cl. .................................................... 371/27
[58] Field of Search ........................... 371/27, 21, 25; 364/200, 900; 324/73 R, 73 AT, 73 PC

[56] References Cited

U.S. PATENT DOCUMENTS

| 4,287,594 | 9/1981 | Shirasaka | 371/25 |
| 4,313,200 | 1/1982 | Nishiura | 371/25 |
| 4,402,081 | 8/1983 | Ichimiya et al. | 371/21 |
| 4,450,560 | 5/1984 | Conner | 371/27 X |

Primary Examiner—Charles E. Atkinson
Attorney, Agent, or Firm—Staas & Halsey

[57] ABSTRACT

A test pattern generator includes means for reading out a plurality of memories non-successively while outputting the test patterns stored identically in the addresses of the memories, such as for sequentially repeating the test patterns that are provided to a logic circuit being tested. The sequence of test patterns is determined by a series of instructions which are accessed by a program counter, and the instructions can cause a jump in the counting of the program counter, for instance to repeat addresses of the memories for repeating a desired sequence of test patterns a predetermined number of times. The timing of the addressing of the memories for the reading out of the test patterns can be faster than the timing for writing the test patterns into the memories for storage.

11 Claims, 40 Drawing Figures

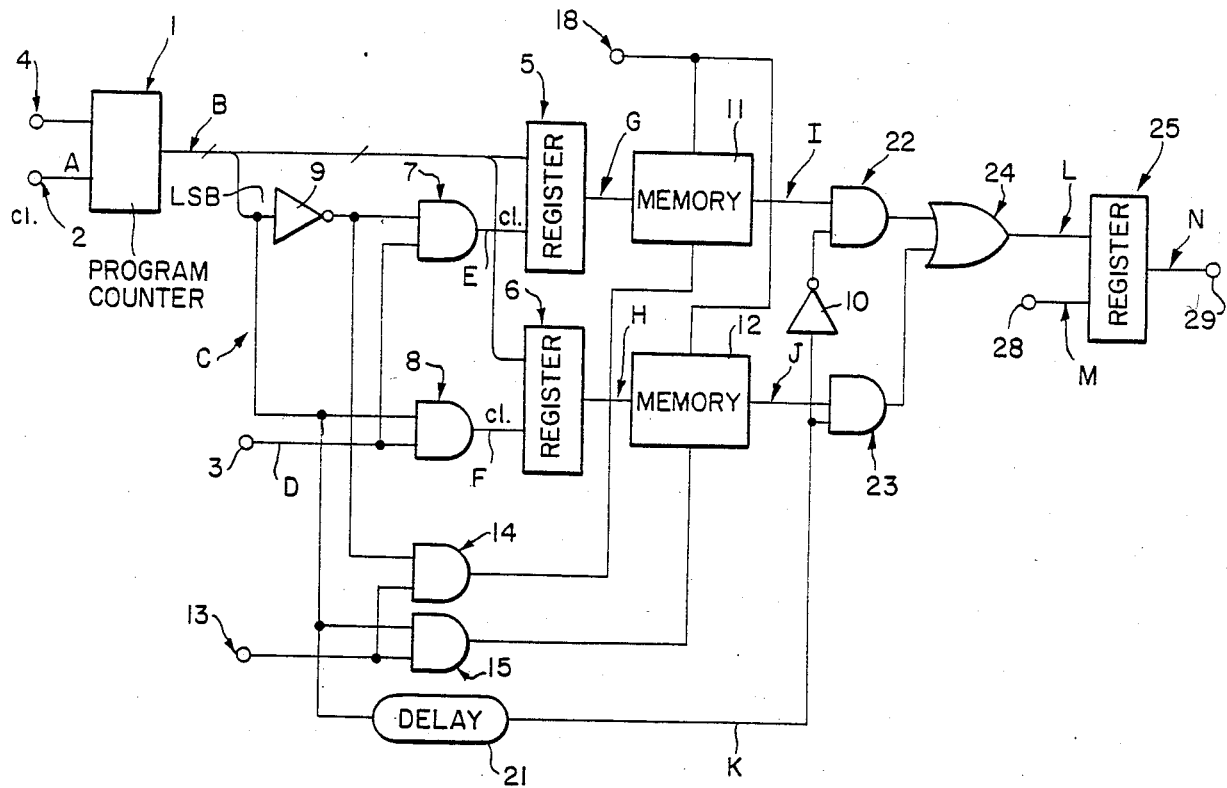

| 0 | $D_0$ |
|---|---|
| 1 | $D_1$ |
| 2 | $D_2$ |
| 3 | $D_3$ |
| 4 | $D_4$ |
| 5 | $D_5$ |
| 6 | $D_6$ |
| ⋮ | |
| n-1 | |

| 0 | $D_0$ |
|---|---|
| 1 | $D_1$ |
| 2 | $D_2$ |
| 3 | $D_3$ |
| 4 | $D_4$ |
| 5 | $D_5$ |
| 6 | $D_6$ |
| ⋮ | |
| n-1 | |

| 0 | $D_0$ |
|---|---|
| 1 | $D_1$ |
| 2 | $D_2$ |
| 3 | $D_3$ |
| 4 | $D_4$ |
| 5 | $D_5$ |
| 6 | $D_6$ |
| ⋮ | |
| n-1 | |

| 0 | $D_0$ |
|---|---|
| 1 | $D_2$ |
| 2 | $D_2$ |
| 3 | $D_3$ |
| 4 | $D_5$ |
| 5 | $D_6$ |
| 6 | $D_6$ |
| ⋮ | |
| n-1 | |

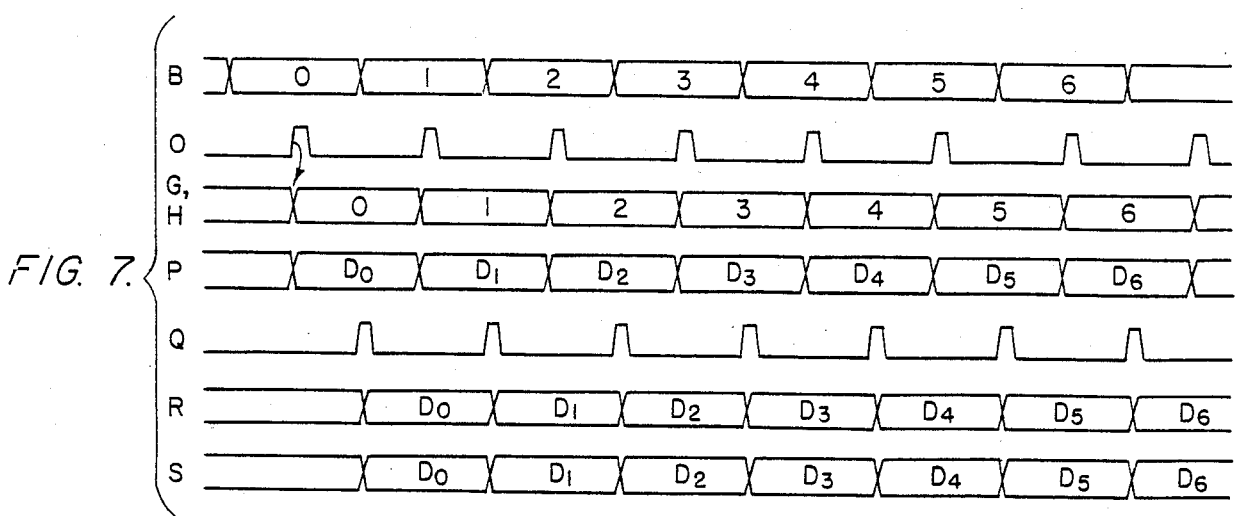
FIG. 7.
FIG. 9.
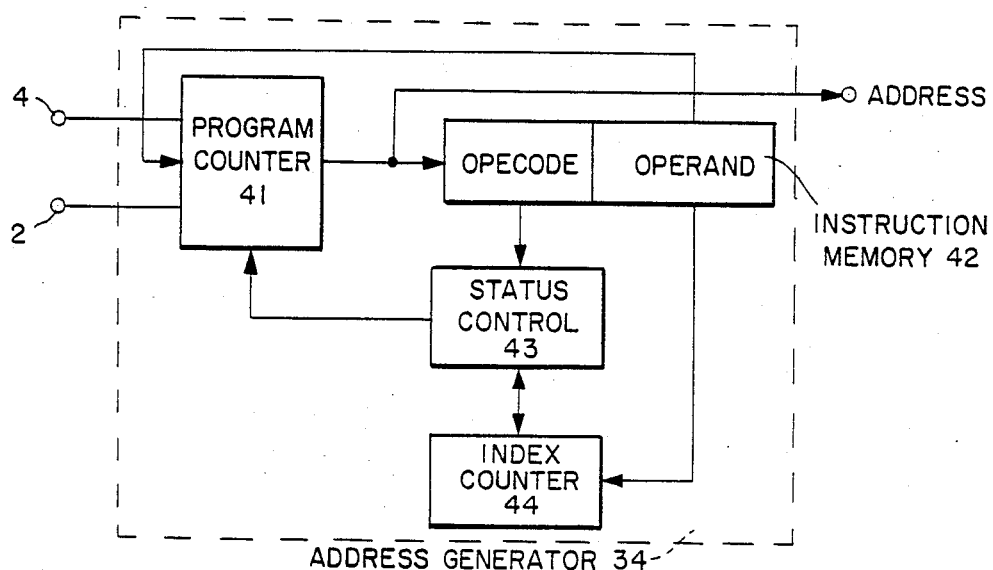
FIG. 10.
| ADDRESS | OPECODE | OPERAND |
|---|---|---|
| 0 | NOP | |
| 1 | NOP | |
| 2 | STI | L-1 |
| 3 | NOP | |
| 4 | NOP | |
| 5 | JNI | 3 |
| 6 | NOP | |
| 7 | NOP | |
| ⋮ | | |
| n | | |

TEST PATTERN GENERATING APPARATUS

BACKGROUND OF THE INVENTION

This invention relates to a test pattern generating apparatus which generates test patterns for testing logic circuits such as semiconductor integrated circuits.

In testing a logic circuit, test patterns are supplied to the logic circuit under test, and the outputs from the logic circuit are compared with expected patterns to determine whether the logic circuit works correctly or not. The test patterns and the expected patterns are previously stored in a memory and read out therefrom when testing a logic circuit. Because of the recent developments in semiconductor devices, logic circuits for example for amplifying the outputs of semiconductor devices have become very high in speed. In order to test such a high speed logic circuit, it is necessary to generate at high speed the test patterns to be supplied to the logic circuit.

For generating test patterns with high speed, the conventional test pattern generating apparatus employs what is called an interleave method in which test patterns are stored in a plurality of memories, and read out alternately from each of the memories and in which the read out patterns are combined in time for obtaining a high speed test pattern. Therefore, in the conventional apparatus, wherein the pattern data is first divided and stored in the plurality of memories, each memory is then accessed by addresses of different phase and the read out data from all the memories is combined in terms of time, the test patterns can be generated with a faster sequence than that of the operating speed of the memories.

However, in this conventional test pattern generating apparatus, the sequence for reading out the pattern data from a plurality of memories is fixed, so that the modification of the test patterns based on pattern data already stored in the memories is not possible. If the test pattern is to be changed, the pattern data in the same memory may have to be read out in succession, so that the time period of the test pattern is directly limited by the access time of each memory. Further, memories of very large capacity are required for generating large and complicated test patterns, such as the galloping, walking and ping-pong test patterns, wherein small loops of patterns are repeated many times.

SUMMARY OF THE INVENTION

It is an object of the present invention to provide a test pattern generating apparatus which is capable of generating a test pattern with high speed.

It is another object of the present invention to provide a test pattern generating apparatus which is capable of generating test patterns of different kinds without changing the pattern data stored in the memories of the apparatus.

It is another object of the present invention to provide a test pattern generating apparatus which is capable of generating very long test patterns by using a plurality of memories of relatively small capacity.

It is a further object of the present invention to provide a test pattern generating apparatus which is capable of easily being operated to store the pattern data in a plurality of memories employed in the apparatus.

According to this invention, the same pattern data are commonly stored in the identical addresses of a plurality of memories. Therefore, when the desired test pattern to be generated in the next cycle is stored in the memory which is to be accessed in the present cycle, the desired test pattern is also stored in another memory, and thusly it is possible to generate the desired test pattern by accessing the other memory in the next cycle. In other words, in the present invention, the desired test pattern is generated by addressing the plurality of memories by turns, without addressing the same memory successively. Thus in the present invention, since the memories are always accessed alternately, even when generating a different test pattern, the speed of the test pattern obtained at the output is not limited by the access time of the memories.

BRIEF DESCRIPTION OF THE DRAWINGS

FIG. 1 shows a circuit diagram of a conventional test pattern generating device.

FIG. 2A is a diagram showing an example of a test pattern that is desired to be generated by the test pattern generating apparatus of FIG. 1.

FIGS. 2B and 2C are diagrams showing examples of storage in the memories employed in the apparatus of FIG. 1 for generating the test pattern of FIG. 2a.

FIG. 7 is a timing chart for explaining the write operation of the embodiment of FIG. 4.

FIG. 9 is a block diagram showing an example of construction of an address generator employed in the embodiment of FIG. A.

FIG. 10 is a diagram showing an example of storage in an instruction memory employed in the address generator of FIG. 9.

DETAILED DESCRIPTION OF THE PREFERRED EMBODIMENT

Figure 3:
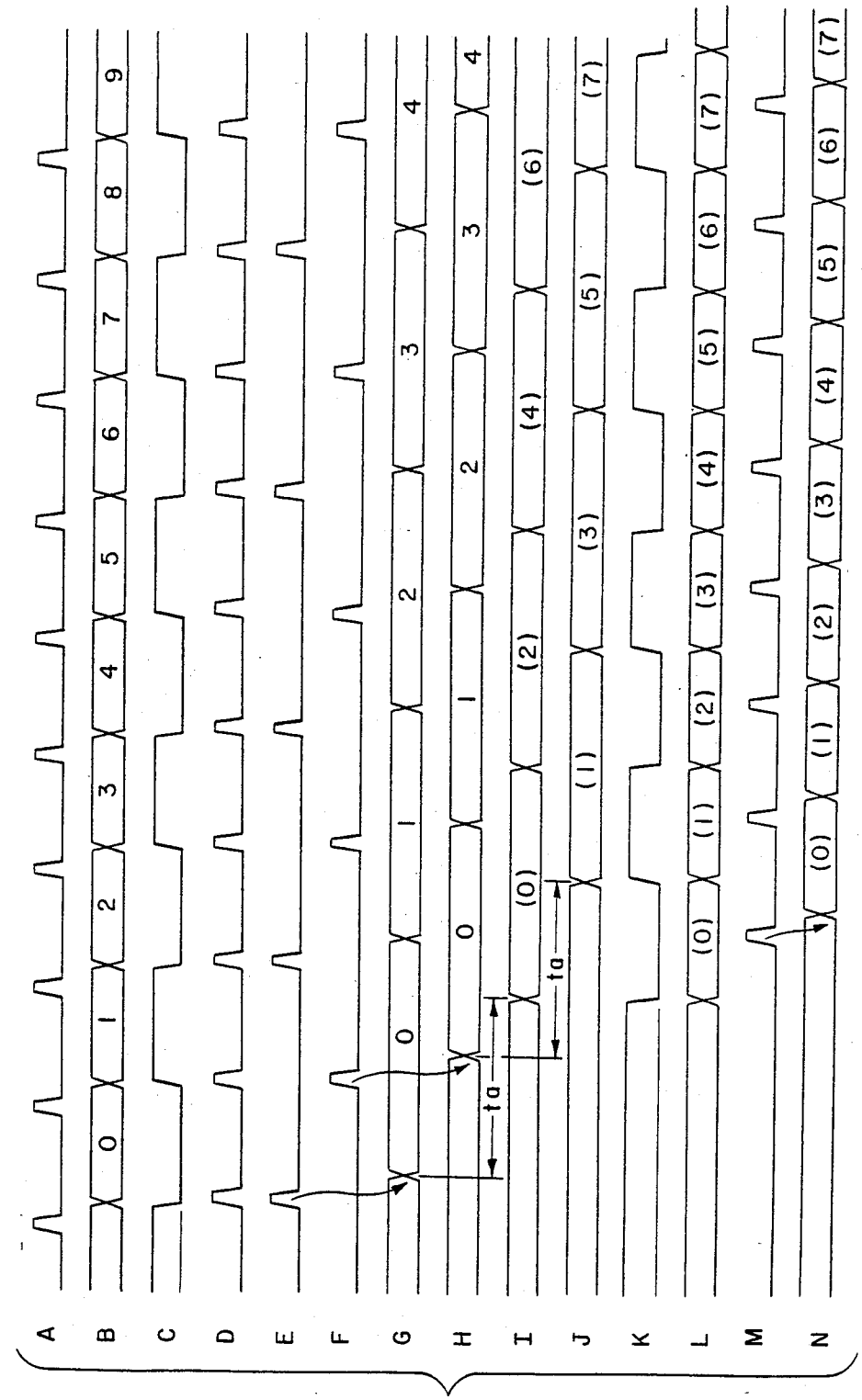
FIGS. 3A to 3N are timing charts for explaining the operation of the conventional apparatus of FIG. 1.

To facilitate a better understanding of the present invention, a description will be given of a conventional test pattern generating apparatus.

FIG. 1 shows a block diagram of the conventional test pattern generating apparatus employing the "interleave method". In FIG. 1 two memories 11 and 12 are employed to store and generate test patterns. The number of memories is selected arbitrarily for improving generation speed. A program counter 1 is comprised of a plurality of universal counters so as to generate addresses having a plurality of bits in synchronism with clock signals supplied from a terminal 2. The initial address from the program counter 1 is determined by the initial data supplied at a terminal 4. Registers 5 and 6 are provided with the address excluding the least significant bit (LSB) from the program counter 1, and take it in synchronism with an address clock supplied from AND gates 7 and 8, respectively. The LSB of the address is provided to both AND gates 7 and 8 whose other input terminals are provided with another address clock from a terminal 3.

Memories 11 and 12 store pattern data supplied from a terminal 18, and they are accessed by the addresses from the registers 5 and 6. The pattern data supplied from a terminal 18 are written into the storage locations of the memories 11 and 12 specified by the address from the registers 5 and 6, when a write pulse supplied from a terminal 13 via AND gates 14 and 15 is at high level. Conversely, when the write pulse is at low level, the pattern data stored in the storage locations of the memories specified by the address are read out so as to provide the pattern data to AND gates 22 and 23. The address clock at the terminal 3, whose time period is equal to that of the clock signal at the terminal 1, is delayed in phase with respect to the clock signals by at least the time required for generating the address by the program counter 1.

A delay circuit 21 adds a delay time to the least significant bit from the program counter 1. The delay time is selected by taking into account the access time of the memories 11 and 12. The delayed signal is provided to the AND gates 22 and 23. The pattern data generated by the memories 11 and 12 are provided to an OR gate 24 via the AND gates 22 and 23, wherein the pattern data from the memories 11 and 12 are combined with each other. A register 25 takes in the combined data from the OR gate 24 in synchronism with a read-out clock from a terminal 28 so that the combined data is provided from a terminal 29 to a logic circuit under test as a test pattern.

FIG. 2A is an example of a test pattern that is desired to be generated at the output terminal 29 of the prior art apparatus of FIG. 1, and FIGS. 2B and 2C are pattern data stored in the memories 11 and 12, respectively, to generate the test pattern of FIG. 2A.

The operation of the conventional test pattern generating apparatus of FIG. 1, for generating the test pattern illustrated in FIG. 2A, will be described with reference to FIG. 3. In synchronism with the clock signal shown in FIG. 3A, the program counter 1 serially generates addresses which start at the address determined by the initial address supplied at the terminal 4. The generated address, without the LSB, is commonly supplied to the registers 5 and 6. When the initial address indicates 0 the address sequence generated by the program counter 1 is for instance 0,1,2,3 . . . as shown in FIG. 3B. When the LSB of the address shown in FIG. 3C is at low level, the AND gate 7 is opened by the inverted LSB, so that the address clock from the terminal 3 is provided to the clock terminal of the register 5. Thus the address that is provided at the time when the address clock occurs is taken into the register 5 as shown in FIG. 3E. Similarly when the LSB is at high level the address is taken into the register 6 in synchronism with the address clock supplied via the AND gate 8, as in FIGS. 3F and 3H. That is, by changing the LSB of the address by 0,1,0,1 . . . as in FIG. 3C, the addresses provided to the registers 5 and 6 are by turns taken into the registers 5 and 6. Since the LSB is eliminated in the address provided to the registers 5 and 6, the addresses as shown in FIGS. 3G and 3H are stored in the registers 5 and 6. The addresses stored in the registers 5 and 6 are supplied to the memories 11 and 12 so as to access the memories 11 and 12 and to read out the test patterns.

When writing the test patterns into the memories, the pattern data as shown in FIG. 2A is provided from the terminal 18 and written into the storage locations of the memories 11 and 12 according to the write pulse from the terminal 13, depending on the addresses provided from the registers 5 and 6, respectively. Since the memories 11 and 12 are accessed alternately by the LSB as mentioned above, the pattern data is spatially divided and stored in the memories 11 and 12. In this way the pattern data as shown in FIGS. 2B and 2C are stored in the memories 11 and 12, respectively.

The operation of the apparatus of FIG. 1 for generating the test pattern shown in FIG. 2A is as follows. Similarly as in regard to the case of writing the test patterns into the memories, the address, excluding the LSB from the address generated by the program counter 1, is taken into the registers 5 and 6 alternately so as to access the memories 11 and 12 by turns as in FIGS. 3G and 3H. The memories 11 and 12 generate the data stored in the address indicated by the addresses from the registers 5 and 6 after a time $t_a$ as in FIGS. 3I and 3J. The time $t_a$ indicates the access time of the memories 11 and 12, that is, the time required for reading out the data from the memories after an address is provided. The data that are read out from the memories 11 and 12 are provided to the AND gates 22 and 23, respectively. The other input terminals of the AND gates 22 and 23 are provided with the LSB of the address via the delay circuit 21 as in FIG. 3K. The delay circuit 21 delays the LSB by at least the access time of the memories 11 and 12. Thus the AND gates 22 and 23 open and close by turns, so that the data read out from the memories 11 and 12 are provided to the OR gate 24. Therefore, the output data of the OR gate 24 is the combined data of the data from both the memories 11 and 12. Thus the combined data has a time sequence that is two times faster than the sequence of each of the data from the memories 11 and 12, as shown in FIG. 3L. The data from the OR gate 24 is taken into the register 25 in synchronism with the read-out clock from the terminal 28, as shown in FIG. 3M, so as to provide the data at the terminal 29 as the test pattern for a logic circuit under test as in FIG. 3N.

As has been described above, according to the conventional test pattern generating apparatus of FIG. 1, since the pattern data stored in the memories 11 and 12 are read out by turns from the memories with different phase and subsequently combined, the resulting test pattern is able to have a sequence that is two times faster than the sequence of the memories 11 and 12. In general, in a test pattern generating apparatus employing the "interleave method", the test pattern to be generated is spatially divided into N parts, is stored in memories and is then read out from each of the N memories alternately with different timing. As explained above, the combined test patterns can accordingly be provided at the output of the test pattern generating apparatus at a speed that is N times faster than the speed of each memory. The generation speed can be increased by increasing the number N.

However, in this test pattern generating apparatus, although the test pattern is generated with high speed, it is not possible to change the test pattern by using the previously stored pattern data, since the sequence of accessing the memories for reading out the pattern data from the memories is fixed. For example, the conventional test pattern generating apparatus cannot generate a test pattern corresponding to the sequence of pattern data (1)(2)(2)(3)(5)(5) . . . , because, for doing this, it is necessary to access the same memory 12 twice in succession for obtaining the pattern data series (2)(2). In order to access the same memory 12 in succession, the repetition rate for accessing the memory 12 is limited by the access time of the memory 12, which causes the test pattern at the output to be low in speed. Thus the address sequence for reading out the pattern data from the memories is fixed to provide the test patterns at high speed. In other words, in the conventional test pattern generating apparatus of FIG. 1, it is not possible to change the test patterns by using the stored data without decreasing the generation speed.

In testing a semiconductor memory, for example, a test pattern that is provided to the memory under test has to proceed by repeating small loops of test patterns many times. For example, a test pattern such as (0)(1)(2)(0)(1)(2)(0)(1)(2) . . . (0) (1)(2)(3)(4)(5)(6) . . . may be required to be provided to the memory under test. For generating this test pattern by using the pattern data stored in the memories as shown in FIGS. 2B and 2C, the memory 12 has to be accessed continuously for obtaining the series of data (2)(0), and thusly the time period of each cycle of the test pattern becomes twice as large as that in the case of generating the test pattern of FIG. 2A. For generating the test pattern with high speed all the pattern data has to be divided one data at a time and stored in a plurality of memories, so that the capacity of the memories become quite large when such a test pattern contains many small loops such as (0)(1)(2). Thus the length of a test pattern becomes quite large. This result is serious when testing a memory of high density, since the length of a test pattern increases as the density of the memory under test increases. Further, in the conventional test pattern generating apparatus, because the capacity of the memories for storing the pattern data need to be large, quite a long time is required to program for storing the pattern data in each of the memories.

Figures 4, 5A, 5B, 5C, 6:
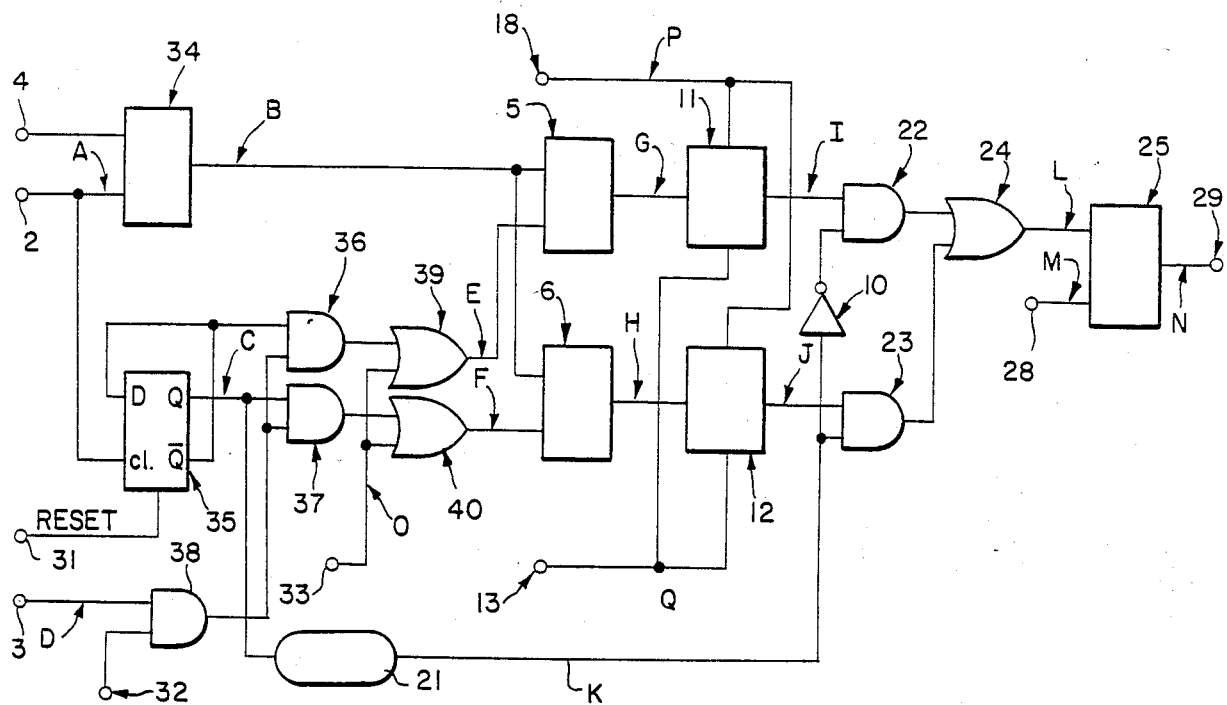
FIG. 4 shows a circuit diagram of a test pattern generating apparatus of the present invention.
FIG. 5A is a diagram showing an example of a test pattern that is desired to be generated by the test pattern generating apparatus of FIG. 4.
FIGS. 5B and 5C are diagrams showing examples of pattern data stored in the memories employed in the embodiment of FIG. 4 for generating the test pattern of FIG. 5A.
FIG. 6 shows an example of another test pattern which is desired to be generated by the embodiment of FIG. 4, by using the stored pattern data shown in FIGS. 5B and 5C.

FIG. 4 shows a circuit diagram of one of the embodiments in accordance with the present invention. In FIG. 4 the components that are identical to those in FIG. 1 are identified by the same reference characters. In this embodiment two memories for storing pattern data are employed, similarly as in regard to the apparatus of FIG. 1, although the number of the memories may be selected arbitrarily for improving the speed of generating the test patterns.

An address generator 34 generates addresses in synchronism with a clock signal supplied from a terminal 2, so as to deliver the addresses to registers 5 and 6. The address generator 34 can generate arbitrary address data with the sequence of the clock signal, according to a program stored in its internal memory and according to the initial address provided from the terminal 4. The detailed operation of the address generator 34 will be described further below. The clock signal is also provided to a clock terminal of a flip-flop 35, so that the state of the flip-flop 35 is changed in synchronism with the clock signal. The flip-flop 35 is reset by a reset signal from a terminal 31. The outputs of the flip-flop 35 are connected to AND gates 36 and 37 whose other input terminals are connected with an output of an AND gate 3B. An address clock signal from the terminal 3 and a read signal from a terminal 32 are provided to respective inputs of the AND gate 38. The outputs of the AND gates 36 and 37 are connected to the OR gates 39 and 40, respectively, whose other input terminals are provided with an address load pulse from a terminal 33. The outputs of the OR gates 39 and 40 are provided to registers 5 and 6, respectively, so as to store temporarily the addresses from the address generator 34 in each of the registers and to provide the addresses to memories 11 and 12. The memories 11 and 12 commonly store identical pattern data from a terminal 18 in the storage locations indicated by the addresses from the registers 5 and 6. AND gates 22 and 23, an OR gate 24 and a register 25 are arranged and operated similarly in regard to those in FIG. 1. A delay circuit 21 is connected between the output of the flip-flop 35 and the AND gates 22 and 23 so as to provide the delayed Q output of the flip-flop 35 to the AND gates 22 and 23.

FIG. 5A is a diagram showing an example of a test pattern that is desired to be generated by the embodiment of FIG. 4, and FIGS. 5B and 5C are diagrams showing examples of pattern data stored in the memories 11 and 12 for producing the test pattern shown in FIG. 5A by the embodiment of FIG. 4.

The operation of the embodiment of FIG. 4, for storing the pattern data shown in FIGS. 5B and 5C and for generating the test pattern as shown in FIG. 5A, is as follows. FIGS. 7B to 7S show timing charts for explaining the operation for writing the pattern data of FIGS. 5B and 5C into memories 11 and 12. In the write operation, the read signal at the terminal 32 is made low level, so that the AND gate 38 is closed to disconnect the address clock from the AND gates 36 and 37. On the other hand, the address load pulse is provided from the terminal 33 to the OR gates 39 and 40. The address generator 34 generates an address which increments by 1 with each occurrence of the pulse of the clock signal. Therefore, the series of addresses 0,1,2,3,4 . . . is generated, as shown in FIG. 7A, when the initial address from the terminal 4 indicates the start address 0.

The repetition rate of the clock signal from the terminal 2 is made low during the write operation in order to obtain enough time for writing the pattern data continuously into the memories. Also during the write operation, the address load pulse shown in FIG. 7O from the terminal 33 is commonly supplied to the registers 5 and 6 through the OR gates 39 and 40. Therefore, the identical address from the address generator 34 is taken into the registers 5 and 6 in synchronism with the address load pulse. The addresses stored in the registers 5 and 6 are respectively provided to the memories 11 and 12. That is, during the write operation, the same addresses are provided to both memories 11 and 12 with the same timing, as shown in FIGS. 7G, H. Accordingly, by the first address load pulse, the address 0 of each of the two memories is specified, and the data D0 from the terminal 18 is written into the memories by the write signal shown in FIG. 7Q from the terminal 13, as indicated in FIGS. 7R and 7S. Next, by the second address load pulse from the terminal 33, the data D1 from the terminal 18 is stored in the address of both memories 11 and 12. In this manner the pattern data illustrated in FIGS. 5B and 5C are identically stored in the memories 11 and 12, respectively.

Figure 8:
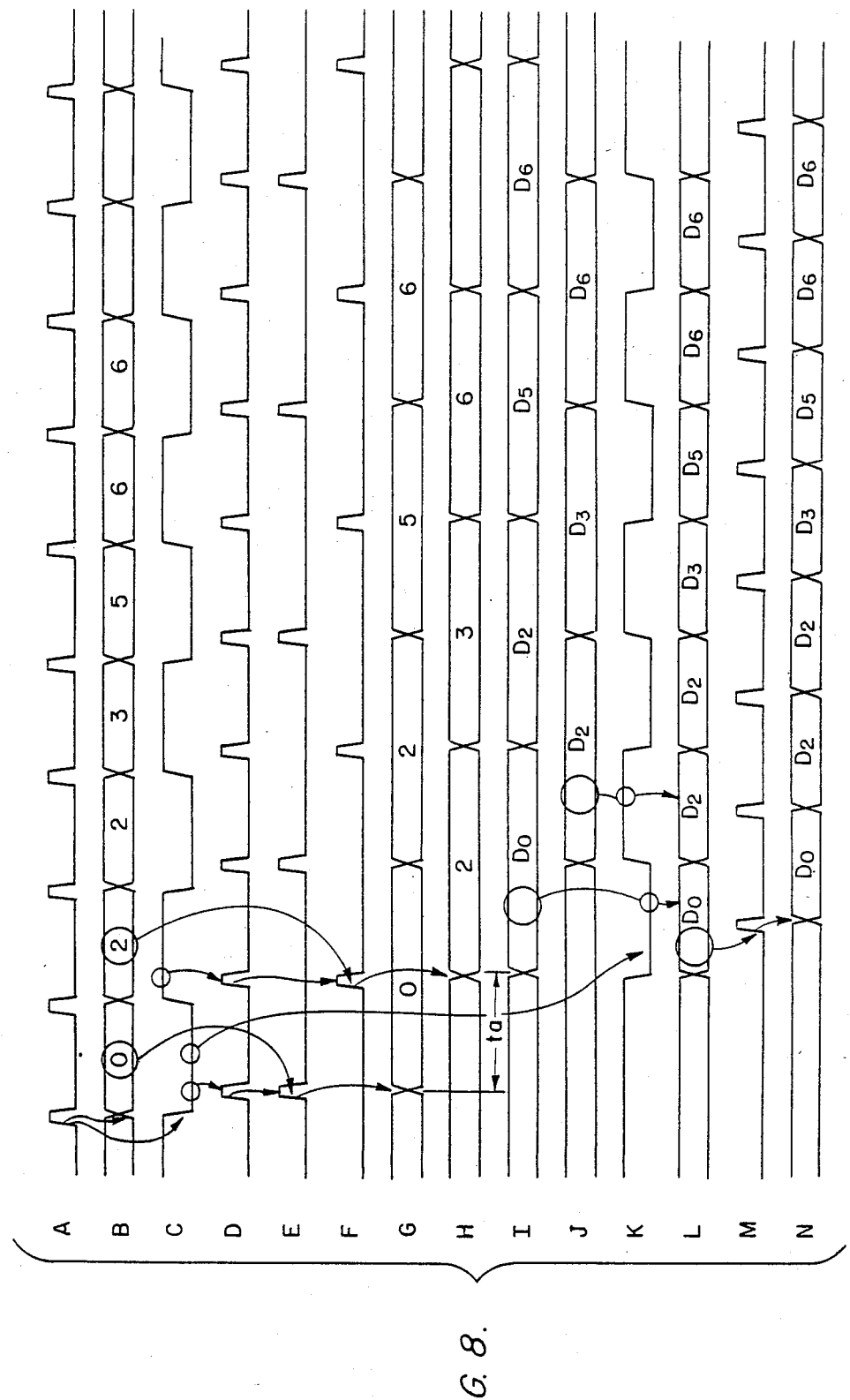
FIGS. 8A to 8N are timing charts for explaining the operation of the embodiment of FIG. 4 for generating the test pattern shown in FIG. 6.

In order to generate the test pattern shown in FIG. 6 by using the stored pattern data of FIGS. 5B and 5C, the embodiment of FIG. 4 works as follows. FIGS. 8A to 8N show timing charts for explaining the operation for generating such a desired test pattern. The address generator 34 is desired in this case to generate the address sequence of 0,2,2,3,5,6,6 . . . in synchronism with the clock signal, as shown in FIG. 8B. In this case, the clock signal that is provided at the terminal 2 must be two times faster than that used in the write operation, relative to the outputs from each of the OR gates 39 and 40 for respectively accessing the memories 11 and 12 through the registers 5 and 6, since each of the memories 11 and 12 is to be alternately accessed for reading out the pattern data. During this operation, the AND gate 38 is opened by the high level of the read signal from the terminal 32, so that the address clock from the terminal 3 is provided to the AND gates 36 and 37. The state of the flip-flop 35 is changed by every occurrence of the clock signals provided at the terminal 2, as shown in FIG. 8A, since the Q output of the flip-flop 35 is connected to the D terminal of the flip-flop 35. The Q and $\overline{Q}$ outputs are respectively connected to the AND gates 36 and 37. Thus the AND gate 36 is closed and the AND gate 37 is opened when the Q output is at high level, and the AND gate 36 is opened and the AND gate 37 is closed when the Q output is at low level. In other words, the AND gates 36 and 37 repeatedly open and close by turns, in synchronism with the clock signal supplied at the terminal 2. Since the read signal from the terminal 32 is at high level, the address clock at the terminal 3 is alternately supplied to the registers 5 and 6, through the AND gates 38, 36 and 37 and the OR gates 39 and 40.

The address clock from the terminal 3 has a period that is equal to the period of the clock signal at terminal 2, and is delayed by at least the time required for operating the flip-flop 35 and the address generator 34. Accordingly, the register 5 takes in the address supplied during the time for which the Q output of the flip-flop 35 is at low level, and, conversely, the register 6 takes in the address supplied during the time for which the Q output is at high level. Thus, as shown in FIG. 8G, the register 5 takes in the series of addresses 0,2,5,6 . . . and provides it to the memory 11 with a time that is twice as fast as the sequence of addresses from the address generator as discussed above in connection with FIG. 8B. Similarly, the register 6 takes in the series of addresses 2, 3, 6 . . . as shown in FIG. 8H and provides it to the memory 12. By the addresses provided from the register 5, the memory 11 generates the pattern data stored in the indicated addresses after the access time $t_a$. Thus the pattern data from the memory 11 becomes D0, D2, D5, D6 . . . as in FIG. 8I. Similarly, by the addresses from the register 6, the pattern data D2, D3, D6 . . . is read out from the memory 12 as in FIG. 8J.

Both data from the memories 11 and 12 are respectively provided to the AND gates 22 and 23 whose other input terminals are respectively provided with the inverted and non-inverted delayed Q output of the flip-flop 35 of FIG. 8K. Thus the AND gates 22 and 23 repeatedly opened and closed with a period that is equal to the period of the clock signal shown in FIG. 8A, and they provide the desired pattern data to the OR gate 24. At the OR gate 24, both pattern data from the AND gates 22 and 23 are combined in terms of time with each other, so that the test pattern D0, D2, D2, D3, D5, D6, D6 . . . is generated at the output of the OR gate 24 as shown in FIG. 8L. Therefore the test pattern is generated from the output terminal by the read-out pulse supplied at the terminal 28, as indicated in FIGS. 8M and 8N.

For generating the test pattern shown in FIG. 5A with high speed by using the pattern data stored in the memories 11 and 12, after the completion of the write operation described above for storing the appropriate pattern data, in the present invention the address generator 34 generates the addresses 0, 1, 2, 3, 4, 5, 6 . . . sequentially in synchronism with a clock signal which is two times faster than that used in the write operation, and the two memories are alternately accessed so as to read out the pattern data therefrom. Thusly, the pattern data D0, D2, D4, D6 . . . are read out from the memory 11 and the pattern data D1, D3, D5 . . . are read out from the memory 12, and then the read out data are combined in terms of time by the OR gate 24, so that the desired test pattern D0, D1, D2, D3, D4, D5, D6 . . . is generated at the output terminal 29.

In both cases above of generating test patterns, namely the cases of FIGS. 5A and 6, the memories 11 and 12 are alternately accessed for reading out the pattern data therefrom, as has been described. Accordingly, in this embodiment, since the same memory is not accessed successively, the speed of the test pattern can be improved even when generating other kinds of test patterns, by using previously stored pattern data. Further, since the same pattern data stored in the memories can be repeatedly read out by controlling the address, the total capacity of the memories can be reduced when generating a test pattern which has many small loops of patterns, as mentioned above. In a test pattern generating apparatus, each pattern data of a test pattern has a large bit length corresponding to the number of terminal pins of the logic circuit under test, for example, a pattern data may be a word of 256 bits. Therefore, the present invention is very effective in reducing the memory capacity.

FIG. 9 is a block diagram showing an example of the address generator 34 employed in the embodiment of FIG. 4. In FIG. 9, 41 is a program counter which generates an address in synchronism with the clock signal from the terminal 2. The generated address is provided to the registers 5 and 6 of FIG. 4 and to an instruction memory 42. The instruction memory 42 stores an operating code (hereinafter referred to as an opecode) and an operand in each address, wherein the addresses are read out by the address from the program counter 41. The operand from the instruction memory 42 is provided to the program counter 41 and to an index counter 44, whereas the opecode is provided to a status control 43. The index counter 44 can be loaded with the operand from the instruction memory 42. The operand is used to control the number of times the same area of each memory is to be accessed when a set command from the status control 43 is provided, according to the opecode. On the other hand, the status control 43 provides a load command to the program counter 41 and a decrement command to the index counter 44, when the opecode from the instruction memory 42 indicates a jump operation and the contents in the index counter 44 is not 0. If the load command from the status control 43 is provided, the program counter 41 loads the operand from the instruction memory 42, which indicates the address that is to be generated in the next cycle, and generates the address in synchronism with the immediately following clock pulse. When the load command is not provided, the program counter 41 generates addresses which increment by 1 in a sequential order in synchronism with the clock signal at the terminal 2. The index counter 44 decrements its contents by 1 if a decrement command is provided from the status control.

In the case of generating addresses which proceed in the order of 0, 1, 2, 3, 4, 5, 3, 4, 5, 3, 4, 5 . . . 6, 7, 8 . . ., that is, in which the address area 3, 4, 5 is to be repeated L times, the address generator 34 works in the following manner. FIG. 10 shows an example of storage in the instruction memory 42 when generating such a series of addresses.

First, the initial address data from the terminal 4 which indicates 0 is set in the program counter 41 so that the address 0 is generated by the first clock pulse. From the address 0 of the instruction memory 42 the opcode NOP which means "no operation" is read out. Since the opcode is NOP, the load command is not provided to the program counter 41 from the status control 43. Thus the program counter 41 generates the address 1 in synchronism with the second clock pulse. Because the opcode from the address is again NOP, the program counter 41 generates the address 2 by the next clock pulse. From the address 2 of the instruction memory, the opcode STI which means "set index" and the operand (L-1) are read out. Again, the L in the operand indicates the number of times the series of addresses 3, 4, 5 is to be sequentially generated. When the operand is STI the status control 43 provides the set command to the index counter 44, so that the operand (L-1) is set in the index counter 44. Also, when the opcode is STI, the load command is not generated from the status control 43, and thusly the address 3 is generated by the program counter 41 in the next cycle. Since the opcodes in the addresses 3 and 4 are NOP as in FIG. 10, the addresses 4 and 5 are generated.

In this manner, the addresses from 0 to 5 are sequentially generated in synchronism with the clock signal. In the address 5 of the instruction memory 42, the opcode JNI meaning "jump if index is not 0" and the operand 3 are stored. When the opcode shows JNI, the status control 43 provides the load command to the program counter 41, so that the operand 3 is set in the program counter 41. At the same time the status control 43 supplies a decrement command to the index counter 44, so that the content in the index counter 44 becomes (L-2). Since the operand 3 is set in the program counter 41, the address 3 is generated therefrom by the immediately following clock pulse. Because the opecode in the addresses 3 and 4 are NOP, the addresses 4 and 5 are sequentially generated again. By the subsequent opecode JNI and the operand 3 from the address 5 of the instruction memory 42, the jump operation again takes place and at the same time the index counter 44 is again decremented.

In this way the jump operation from the address 5 to the address 3 is repeated. After repeating the jump operation (L-1) times, the content in the index counter 44 becomes 0. Accordingly, when the address 5 of the instruction memory 42 is read out the Lth time, the status control 43 this time does not provide the load command to the program counter 41, since the content of the index counter 44 indicates 0. Therefore, in the next cycle the address 6 is generated by the program counter 41. The opecode in both addresses 6 and 7 are NOP as shown in FIG. 10, and the addresses 7 and 8 are correspondingly sequentially generated. In this manner, the series of addresses wherein the address area 3, 4, 5 is repeated L times is generated by the address generator 34.

What is claimed is:

1. A test pattern generating apparatus for generating a test pattern for testing a logic circuit, comprising an address generator for generating a series of desired addresses in synchronism with a clock signal,
a plurality of pattern data memories for storing pattern data for generating the test pattern, said pattern data memories have the same pattern data stored in the same respective addresses,
a plurality of registers for respectively accessing in succession different ones of said pattern data memories by the addresses from the address generator,
selection means for selectively taking out the pattern data from said accessed pattern data memories, and
means for providing an address clock alternately to the plurality of registers, in a respective succession corresponding to said accessing of said pattern data memories, when said pattern data is to be read out from said pattern data memories, and for providing an address clock of the same timing commonly to the plurality of registers when said pattern data is to be written into said pattern data memories.

2. The apparatus of claim 1, comprising means for providing address load pulses with the frequency of said clock signal to the plurality of registers when writing the pattern data into the plurality of pattern data memories.

3. The apparatus of claim 2, wherein said clock for said reading out of pattern data memories comprises clock pulses that occur at a rate that is faster than the rate of said address load pulses for said writing of pattern data into said pattern data memories.

4. The apparatus of claim 3, wherein said clock pulses of said address clock are faster than said address load pulses by a factor equal to the number of said plurality of pattern data memories.

5. The apparatus of claim 2, 3 or 4, wherein all of said pattern data memories have the same pattern data stored in the same respective addresses.

6. The apparatus of claim 1, 2, 3 or 4, wherein said address generator includes a program counter for generating said addresses by incrementing from an initial address supplied thereto, and an instruction memory having addresses corresponding to the addresses of said pattern data memories, wherein the instruction memory is accessed by said addresses generated by said program counter to provide selected jumping in the counting of said program counter.

7. The apparatus of claim 6, wherein said addresses of said instruction memory selectively store an operating code for indicating whether said incrementing or said jumping of said program counter is to occur and an operand for providing the address to which said jumping in the counting of said program counter is to occur.

8. The apparatus of claim 7, said address generator comprising a status control and an index counter, wherein said operand of the address provided by said program counter is provided to said program counter, and the operating code of the address of the instruction memory being accessed by said program counter is provided to said status control, so that a load command is provided from said status control to said program counter to take in the respective operand for said jumping.

9. The apparatus of claim 8, wherein said addresses of said instruction memory generated by said program counter, selectively provide an operating code indicating a set index instruction, before providing each said jump instruction, and the operand of the respective address of said set index instruction is provided to said status control to control the number of times the respective jumping of said program counter is to occur.

10. The apparatus of claim 1, wherein said test pattern is selectively provided with repeated portions corresponding to the same pattern data being selected by said selection means from different ones of said pattern data memories.

11. The apparatus of claim 1, wherein said selective taking out of pattern data from said pattern data memories by said selection means corresponds to said providing of said address clock to said pattern data memories in said respective succession.

* * * * *

UNITED STATES PATENT AND TRADEMARK OFFICE
CERTIFICATE OF CORRECTION

PATENT NO. : 4,586,181

DATED : 29 April 1986

INVENTOR(S) : MASAO SHIMIZU

It is certified that error appears in the above-identified patent and that said Letters Patent is hereby corrected as shown below:

Col. 5, line 3, "(5)(5)" should be --(4)(5)--.

Col. 7, line 15, "$\bar{Q}$outputs" should be --$\bar{Q}$ outputs--.

Signed and Sealed this

Sixteenth Day of September 1986

[SEAL]

*Attest:*

DONALD J. QUIGG

*Attesting Officer*  *Commissioner of Patents and Trademarks*